(12) United States Patent
Hwang

(10) Patent No.: US 9,374,932 B2
(45) Date of Patent: Jun. 21, 2016

(54) HYBRID INSULATION SHEET AND ELECTRONIC APPARATUS USING THE SAME

(71) Applicant: AMOGREENTECH CO., LTD., Gimpo-si (KR)

(72) Inventor: Seung Jae Hwang, Incheon (KR)

(73) Assignee: AMOGREENTECH CO., LTD. (KR)

( * ) Notice: Subject to any disclaimer, the term of this patent is extended or adjusted under 35 U.S.C. 154(b) by 125 days.

(21) Appl. No.: 14/459,544

(22) Filed: Aug. 14, 2014

(65) Prior Publication Data

US 2014/0376191 A1    Dec. 25, 2014

Related U.S. Application Data

(63) Continuation of application No. PCT/KR2014/005438, filed on Jun. 19, 2014.

(30) Foreign Application Priority Data

| Jun. 19, 2013 | (KR) | 10-2013-0070481 |
| Oct. 31, 2013 | (KR) | 10-2013-0131034 |
| Dec. 31, 2013 | (KR) | 10-2013-0168277 |
| Feb. 17, 2014 | (KR) | 10-2014-0017744 |
| Feb. 17, 2014 | (KR) | 10-2014-0017745 |
| Jun. 19, 2014 | (KR) | 10-2014-0074798 |

(51) Int. Cl.
    *H05K 7/20*      (2006.01)
    *F28F 13/00*     (2006.01)
    *F28F 13/18*     (2006.01)
    (Continued)

(52) U.S. Cl.
    CPC ............ *H05K 7/2039* (2013.01); *F28F 13/003* (2013.01); *F28F 13/18* (2013.01); *F28F 21/02* (2013.01); *H01L 23/36* (2013.01); *H01L 23/3733* (2013.01); *H01L 23/3737* (2013.01);
    (Continued)

(58) Field of Classification Search
    CPC ....... G06F 1/18–1/189; G06F 1/1601–1/1611; G06F 1/1613–1/1698; H05K 7/20218–7/20381; H05K 7/20409–7/20418; H05K 7/20009–7/202; H05K 5/00–5/069; H05K 7/00–7/186; H01L 23/367–23/3677; H01L 23/475; H01L 23/46–23/467
    USPC ........................ 361/676–678, 679.46–679.54, 361/688–727, 679.01–679.45, 361/679.55–679.61, 679.26–679.3, 361/679.31–679.39; 165/80.1–80.5, 165/104.33, 185; 174/15.1–15.3, 174/16.1–16.3, 547, 548; 257/712–722, 257/E23.088; 455/575.1–575.9; 312/223.1–223.3; 348/787, 789, 794; 349/56–60
    See application file for complete search history.

(56) References Cited

U.S. PATENT DOCUMENTS

| 6,011,697 A * | 1/2000 | Budnaitis | H01L 23/142 174/255 |
| 8,681,502 B2 * | 3/2014 | Wu | B29C 45/14311 165/80.3 |

(Continued)

FOREIGN PATENT DOCUMENTS

KR    1020070001760    1/2007

*Primary Examiner* — Anthony Haughton
*Assistant Examiner* — Razmeen Gafur
(74) *Attorney, Agent, or Firm* — Cantor Colburn LLP

(57) ABSTRACT

Provided are an insulation sheet and an electronic apparatus using the same. The insulation sheet includes: a radiating layer that spreads and radiates heat generated from a heat generating component of an electronic apparatus; and an insulating layer that suppresses the heat saturated in the radiating layer from being delivered to the outside of the electronic apparatus.

19 Claims, 15 Drawing Sheets

(51) Int. Cl.
  *F28F 21/02* (2006.01)
  *H01L 23/36* (2006.01)
  *H01L 23/373* (2006.01)
  *H01L 23/473* (2006.01)
  *H05K 1/02* (2006.01)
  *H04M 1/02* (2006.01)

(52) U.S. Cl.
  CPC ........ *H01L 2924/0002* (2013.01); *H04M 1/026* (2013.01); *H05K 1/028* (2013.01)

(56) References Cited

U.S. PATENT DOCUMENTS

| | | | | |
|---|---|---|---|---|
| 8,753,924 B2* | 6/2014 | Wainerdi | ............... | H01L 24/29 257/675 |
| 8,837,151 B2* | 9/2014 | Hill | ................... | H05K 7/20482 361/704 |
| 8,976,335 B2* | 3/2015 | Beerens | ............. | G03F 7/70875 310/12.06 |
| 2002/0020547 A1* | 2/2002 | Negle | ........................ | H05G 1/06 174/138 R |
| 2002/0141155 A1* | 10/2002 | Pinneo | ................. | C23C 16/272 361/688 |
| 2003/0043543 A1* | 3/2003 | Farrar | ..................... | H01L 23/42 361/690 |
| 2006/0103015 A1* | 5/2006 | Farrar | ..................... | H01L 23/42 257/712 |
| 2006/0157223 A1* | 7/2006 | Gelorme | ............ | H01L 23/3733 165/80.3 |
| 2007/0102140 A1* | 5/2007 | Tuma | ................. | H01L 23/3732 165/80.3 |
| 2007/0159799 A1* | 7/2007 | Dando | ............... | H05K 7/20454 361/709 |
| 2007/0165376 A1* | 7/2007 | Bones | ................... | H01L 25/162 361/688 |
| 2008/0043919 A1* | 2/2008 | Chapin | .................... | H05G 1/04 378/119 |
| 2008/0130223 A1* | 6/2008 | Nakamura | ............ | H02M 7/003 361/689 |
| 2008/0151487 A1* | 6/2008 | Ni | ........................ | H01L 23/367 361/679.31 |
| 2008/0225491 A1* | 9/2008 | Martinez | ................ | H01L 23/10 361/709 |
| 2009/0040724 A1* | 2/2009 | Nishikimi | ......... | H05K 7/20927 361/699 |
| 2009/0168358 A1* | 7/2009 | Koike | ................... | H05K 7/209 361/709 |
| 2009/0231811 A1* | 9/2009 | Tokuyama | .............. | H01L 23/36 361/699 |
| 2010/0025126 A1* | 2/2010 | Nakatsu | ................. | B60L 11/00 180/65.1 |
| 2010/0321895 A1* | 12/2010 | Hill | .................... | H05K 7/20472 361/715 |
| 2011/0032678 A1* | 2/2011 | Altman | ................ | H01L 23/373 361/709 |
| 2011/0069455 A1* | 3/2011 | Tokuyama | ........... | H01L 23/473 361/702 |
| 2012/0135867 A1* | 5/2012 | Thom | .................. | H03H 7/0115 505/210 |
| 2012/0195005 A1* | 8/2012 | Asano | ..................... | H01F 27/22 361/710 |
| 2012/0320532 A1* | 12/2012 | Wang | ..................... | H05K 1/189 361/720 |

* cited by examiner

※ 30 MINUTES          (A)

※ 60 MINUTES          (B)

INITIAL          24 HOURS          48 HOURS          72 HOURS (A)

30 MINUTES (B)

60 MINUTES (C)

30 MINUTES (D)

60 MINUTES

HYBRID INSULATION SHEET AND ELECTRONIC APPARATUS USING THE SAME

CROSS REFERENCE TO RELATED APPLICATIONS

This is a continuation application of International Application No. PCT/KR2014/005438, filed on Jun. 19, 2014, which claims a priority to and the benefit of Korean Patent Application Nos. 10-2013-0070481, filed on Jun. 19, 2013; 10-2013-0131034, filed on Oct. 31, 2013; 10-2013-0168277, filed on Dec. 31, 2013; 10-2014-0017744, filed on Feb. 17, 2014; 10-2014-0017745, filed on Feb. 17, 2014; and 10-2014-0074798, filed on Jun. 19, 2014, the contents of which in their entirety are herein incorporated by reference.

TECHNICAL FIELD

The present invention relates to a hybrid insulation sheet, and more particularly to, an insulation sheet that is formed even in an ultra-thin shape to then radiate and insulate heat generated from a heat generation unit in an electronic apparatus, and an electronic apparatus using the same.

BACKGROUND ART

In the case that electronic apparatuses such as computers, displays, and mobile phones, do not radiate heat generated from the inside of the electronic apparatuses, screen image retention, system failure, or shortening of product life may be caused due to excessively accumulated heat, and in severe cases explosion or fire may be caused.

In particular, portable terminals such as mobile phones (or smart phones) essentially require miniaturization and weight reduction in order to maximize portability and convenience of users, and are configured by mounting more and more integrated components in a small space to secure high performance. Accordingly, components used in the portable terminal may cause a higher heating temperature due to the high performance of the portable terminal, and the elevated temperature of the heat affects the adjacent components to degrade the performance of the portable terminal.

Meanwhile, a portable terminal such as a mobile phone is frequently used at a state where the mobile phone contacts a human face in use, and consequently the heat generated in the portable terminal is transferred to the skin of a user, to thereby cause proteins of the skin of the user to be damaged, that is, to thereby cause a problem of inflicting low-temperature burns on the user. Accordingly, the heat delivered to the outside of the mobile terminal needs to be lowered down to a certain temperature or lower.

In order to solve such a problem caused by heat generation of the portable terminal, a variety of insulating materials are employed, but an optimal insulation material whose thickness is thin and whose insulation and heat dissipation performance are excellent has not yet developed. Accordingly, a variety of researches and technology developments are urgently required.

Graphite is widely used as the heat radiation material. However, graphite is very expensive, and has excellent heat radiation performance, but has poor insulation performance. As a result, it is limited to employ graphite. Since no materials that may replace the graphite have been developed yet, although manufacturers know that graphite may cause a problem, graphite is still used.

Meanwhile, Korea Patent Registration No. 10-1134880 discloses a technology of preventing heat generated from a mobile terminal from being delivered to a user's face through a liquid crystal display (LCD) panel in which an insulation film is disposed on the front surface of the LCD panel. However, this insulation film is a low emissivity film that allows a transmittance of visible light at maximum and blocks passage of heat, and is attached on the front surface of the LCD panel. Such a low emissivity insulation film reaches the limit in insulating high temperature heat generated from components built in a portable terminal, and thus cannot solve problems caused by heat generated from high performance mobile terminals, in recent years.

DISCLOSURE

Technical Problem

To solve the above problems or defects, it is an object of the present invention to provide a hybrid insulation sheet and an electronic apparatus using the same, in which heat generated from heat generating components of the electronic apparatus is spread to thus prevent deterioration of the heat generating components and also block the heat generated from the heat generating components from being delivered to other components.

It is another object of the present invention to provide a hybrid insulation sheet and an electronic apparatus using the same, in which heat generated from heat generating components of the electronic apparatus is suppressed from being delivered to the outside of the electronic apparatus, to thereby maintain temperatures of front and rear surfaces of the electronic apparatus to be at a prescribed temperature or below.

It is still another object of the present invention to provide a hybrid insulation sheet and an electronic apparatus using the same, in which the hybrid insulation sheet is implemented with an extremely small thickness so as not to increase the thickness of the electronic apparatus, while having excellent radiation and insulation performance and very low price when compared to a conventional hybrid graphite sheet.

Technical Solution

To accomplish the above and other objects of the present invention, according to an aspect of the present invention, there is provided a hybrid insulation sheet comprising: a radiating layer that spreads and radiates heat generated from a heat generating component of an electronic apparatus; and an insulating layer that suppresses the heat saturated in the radiating layer from being delivered to the outside of the electronic apparatus.

Preferably but not necessarily, the radiating layer is a layer that spreads the heat generated from the heat generating component in the horizontal direction, and the insulating layer is a layer that suppresses the heat saturated in the radiating layer from being delivered in the vertical direction.

Preferably but not necessarily, the radiating layer comprises a plate-like member having a conductivity of at least 200 W/mk, and the insulating layer comprises a plate-like member having a conductivity of at least 20 W/mk.

Preferably but not necessarily, the insulating layer comprises a porous substrate having a large number of fine pores that form air pockets capable of trapping air, in which the fine pores are less than 5 μm in size.

Preferably but not necessarily, the porous substrate is formed of one selected from a nano-fiber web, a non-woven fabric, and a laminate structure of these nano-fiber web and non-woven fabric, having a number of pores that are formed by accumulating nano-fibers.

Preferably but not necessarily, the radiating layer comprises a thin film member formed of one selected from Cu, Al, Ni, Ag, and graphite.

Preferably but not necessarily, the hybrid insulation sheet further includes an adhesive layer that bonds the radiating layer and the insulating layer, in which the adhesive layer comprises one of acrylic, epoxy, aramid-based, urethane-based, polyamide-based, polyethylen-based, EVA-based, and polyester-based adhesives.

Preferably but not necessarily, the adhesive layer comprises a hot melt web or a hot melt powder having a large number of pores formed by accumulating fibers capable of being thermally bonded.

Preferably but not necessarily, the radiating layer comprises a first radiating layer having a first conductivity; and a second radiating layer having a second conductivity bonded on the first radiating layer, and the first conductivity of the first radiating layer is the same as or different from the second conductivity of the second radiating layer.

Preferably but not necessarily, the first conductivity of the first radiating layer is lower than the second conductivity of the second radiating layer, and the first radiating layer is attached to, contacts or approaches the heat generating component.

Preferably but not necessarily, the first radiating layer is made of one metal of Al, Mg, and Au and the second radiating layer is made of Cu; the first radiating layer is made of Cu and the second radiating layer is made of Ag; or the first radiating layer is made of one of Al, Mg, Au, Ag, and Cu and the second radiating layer is made of graphite.

Preferably but not necessarily, the first radiating layer and the second radiating layer are diffusedly bonded or adhesively bonded.

Preferably but not necessarily, the hybrid insulation sheet further includes a thermal radiation thin film formed on the radiating layer in which the thermal radiation thin film is one of a coating film containing a graphene powder, a graphene thin film, and a film that is obtained by being coated with a nano-sol form which heat radiation particles are dispersed and being gelated and heat-treated.

Preferably but not necessarily, the hybrid insulation sheet further includes an adhesive layer laminated on the radiating layer, in which the adhesive layer comprises at least one selected from a heat-conductive metal, carbon black, carbon nano-tube, graphene, heat conducting polymer (PDOT).

Preferably but not necessarily, the hybrid insulation sheet further includes a protective film laminated on the insulating layer, in which adhesion power of the adhesive layer is equal to or different from that of the protective layer.

Preferably but not necessarily, the hybrid insulation sheet further includes an oxidation preventing film on the surface of the radiating layer, in which the oxidation preventing film comprises a Ni coated film.

According to another aspect of the present invention, there is also provided a hybrid insulation sheet comprising: a first radiating layer that spreads heat generated from a heat generating component of an electronic apparatus in the horizontal direction and radiates the heat primarily; an insulating layer that suppresses the heat saturated in the first radiating layer from being delivered in the vertical direction; and a second radiating layer that spreads the heat delivered from the insulating layer in the horizontal direction and radiates the heat secondarily.

According to another aspect of the present invention, there is also provided an electronic apparatus comprising: a bracket; a display panel mounted on the bracket; a flexible printed circuit board (FPCB) in which an AP (Application Processor) IC and a PM (Power Management) IC are mounted; a removable back cover; an inner cover that is positioned between the FPCB and the back cover and covers the bracket and the FPCB; and a case containing a USIM (universal subscriber identity module card) chip and a micro memory that are mounted in the inner cover, wherein the electronic apparatus further comprises a hybrid insulation sheet claimed in any one of claims 1 to 26, wherein the hybrid insulation sheet is mounted in at least one selected from a cushion layer region facing the bracket, a USIM chip and micro memory mounted case region, and a back cover region, to thus spread and radiate heat generated from heat generating components and suppress the heat from being delivered to the outside of the electronic apparatus and maintain an external temperature of the electronic apparatus to be at a certain temperature or below.

Advantageous Effects

As described above, the present invention spreads heat generated from a heat generating component of an electronic apparatus, to thus prevent deterioration of the heat generating component, and blocks the heat generated from the heat generating component from being transferred to other components.

The present invention suppresses heat generated from a heat generating component of an electronic apparatus from being delivered to the outside of the electronic apparatus, and thus maintains temperatures of front and rear surfaces of the electronic apparatus to be at a prescribed temperature or below.

In the present invention, the hybrid insulation sheet is implemented with an extremely small thickness so as not to increase the thickness of the electronic apparatus, while having excellent radiation and insulation performance.

In the present invention, heat generated from a heat generating component of an electronic apparatus is spread at a radiating layer to then be radiated, and the heat saturated in the radiating layer is suppressed in the insulating layer from being delivered to the outside of the electronic apparatus, to thus prevent a user who closely approaches or contacts the electronic apparatus from being inflicted from low-temperature burns.

BEST MODE

The above and other objects, features, and advantages of the present invention can be appreciated by the following description and will be understood more clearly by embodiments of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Figure 1:
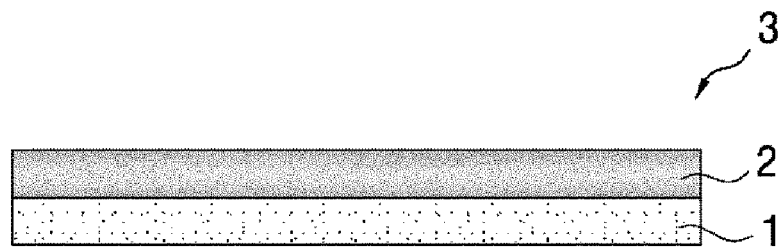
FIG. 1 is a cross-sectional view of a hybrid insulation sheet according to the present invention.

Referring to FIG. 1, a hybrid insulation sheet 3 according to an embodiment of the present invention includes: a radiating layer 1 that spreads and radiates heat generated from a heat generating component of an electronic apparatus; and an insulating layer 2 that suppresses the heat saturated in the radiating layer 1 from being delivered to the outside of the electronic apparatus.

The hybrid insulation sheet 3 according to the present invention is in contact with, is bonded to, and closely adjacent to a heat generating component, to thereby spread and radiate heat generated from a heat generating component through the radiating layer 1, and suppress the heat saturated in the radiating layer 1 from being delivered to the outside through the insulating layer 2.

The radiating layer 1 can be made of a material having a conductivity of approximately 200 to 3000 W/mk, i.e., any one selected from Cu, Al, Ag, Ni and graphite, and a combination thereof. Given a unit price or characteristics, Cu or graphite, and a laminate structure of Cu and graphite can be preferably used.

The insulating layer 2 can be made of a plate-like member having a conductivity of 20 W/mk or less. In particular, a porous substrate having a large number of fine pores that enable air to be used as an insulating material by trapping air and suppressing convection of air is used as the insulating layer 2 in the present invention.

In some embodiments, the hybrid insulation sheet 3 further includes an adhesive layer (not shown) that bonds the radiating layer 1 and the insulating layer 2.

Here, the adhesive layer includes one of acrylic, epoxy, aramid-based, urethane-based, polyamide-based, polyethylen-based, EVA-based, polyester-based, and PVC-based adhesives. Otherwise, the adhesive layer may be a web-shaped hot melt adhesive sheet having a large number of pores formed by accumulating fibers capable of being thermally bonded, or a non-pore hot melt adhesive sheet. The adhesive layer may include a conductive filler.

Further, the radiating layer 1 may be composed of a double structure including: a first radiating layer having a first conductivity, to thereby spread transferred heat; and a second radiating layer having a second conductivity different from the first conductivity and bonded on the first radiating layer, to thereby spread heat transferred from the first radiating layer.

Here, the first conductivity of the first radiating layer may be the same as or different from the second conductivity of the second radiating layer. In the case that the first and second conductivities differ from each other, the first conductivity of the first radiating layer is lower than the second conductivity of the second radiating layer, and the first radiating layer whose conductivity is relatively lower than that of the second radiating layer is attached to, contacts or approaches the heat generating component.

In addition, the first radiating layer and the second radiating layer may be diffusedly bonded. In this case, a bonding layer that is formed by diffusion bonding may be formed between the first radiating layer and the second radiating layer.

In this case, the hybrid insulation sheet according to the present invention may be implemented into any one of a first structure that the first radiating layer is made of one metal of Al, Mg, and Au and the second radiating layer is made of Cu; a second structure that the first radiating layer is made of Cu and the second radiating layer is made of Ag; and a third structure that the first radiating layer is made of one of Al, Mg, Au, Ag, and Cu and the second radiating layer is made of graphite.

Figure 2:
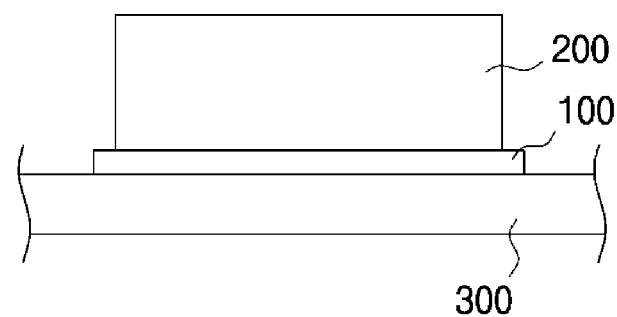
FIG. 2 is a partial sectional view of an electronic apparatus to which a hybrid insulation sheet of the present invention is attached.

Referring to FIG. 2, an insulation sheet 100 according to the present invention is disposed between a heat generating component 200 that generates heat in an electronic apparatus and another component 300 that does not generate heat in the electronic apparatus, to thereby play a role of spreading and radiating the heat generated from the heat generating component 200, and suppressing the heat generated from the heat generating component 200 from being delivered to the other component 300.

Because the heat generating component 200 generates locally high-temperature heat, the heat generating component 200 itself may be damaged by the high-temperature heat, and because the high-temperature heat is transferred to the other component 300 disposed in the vicinity of the heat generating component 200, the other component 300 may be damaged by the high-temperature heat.

In particular, the other component 300 may be a back cover in a portable terminal. In this case, when a user wraps up the back cover by hand, the heat generated from the heat generating component 200 may be delivered to the hand of the user through the back cover. Accordingly, the user may be inflicted with a low-temperature burn or feels uncomfortable in use.

Accordingly, the insulation sheet 100 according to the present invention quickly spreads heat generated from the heat generating component 200 to thus prevent the heat generating component 200 from being locally highly heated to thus prevent the heat generating component 200 from being damaged by the heat, and to thus suppress the heat generated from the heat generating component 200 from being delivered to the other component 300.

In addition, insulation sheets that will be described below according to embodiments of the present invention may be mounted on portable terminals that are kinds of electronic apparatuses. In this case, an insulating sheet mounted on a portable terminal can perform a function of radiating and insulating heat generated in the portable terminal. As a result, the heat generated from a hot spot in the portable terminal is dispersed, to thus minimize thermal effects on internal components of the portable terminal, and to thus suppress the heat generated from the hot spot in the portable terminal from being leaked to the outside of the portable terminal to thereby minimize heat to be delivered to a user who grips the portable terminal.

Meanwhile, it is preferable that an insulation sheet is mounted in the inside of a back cover (not shown) of a portable terminal. Here, the portable terminal includes: a portable terminal main body (not shown) that performs a function of the portable terminal; and a back cover that can be detachably mounted in the rear side of the portable terminal main body. There are regions where a battery, a memory chip, etc., are mounted, in the rear side of the portable terminal main body. The back cover is detachably mounted in order to replace the battery, the memory chip, etc., with a convenient way, and for the appearance of the portable terminal. Here, the insulation sheet may be mounted in contact with or adjacent to the heat generating component that is built in the portable terminal main body of the portable terminal.

The portable terminal main body has built-in high-speed and high-performance chips, in which the high-speed and high-performance chips are heat generating components, and thus are in operation to cause a hot spot area to be made so as to make heat concentrated on a localized area. Since an insulation sheet is mounted in the inside of the back cover, and thus in the case that the back cover is coupled with the portable terminal main body, the insulation sheet is closely adhered to the hot spot area and receives the heat generated in the hot spot area, to thus perform a function of spreading and insulating heat.

Figure 3:
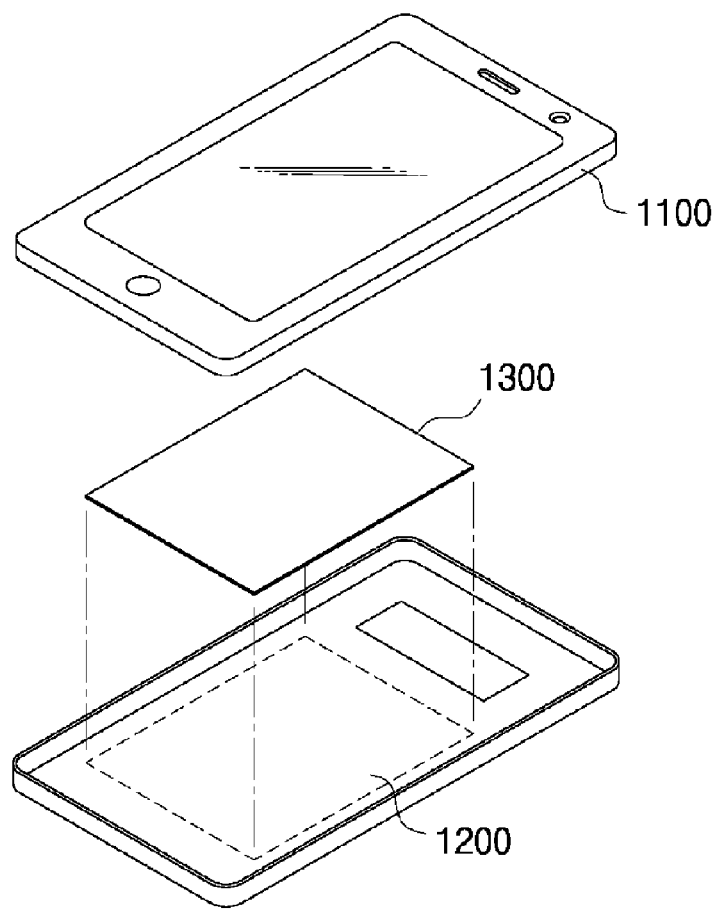
FIG. 3 is an exploded perspective view showing a portable terminal having a hybrid insulation sheet according to a first embodiment of the present invention in which a back cover of the portable terminal is decomposed from the portable terminal.
Figure 4:
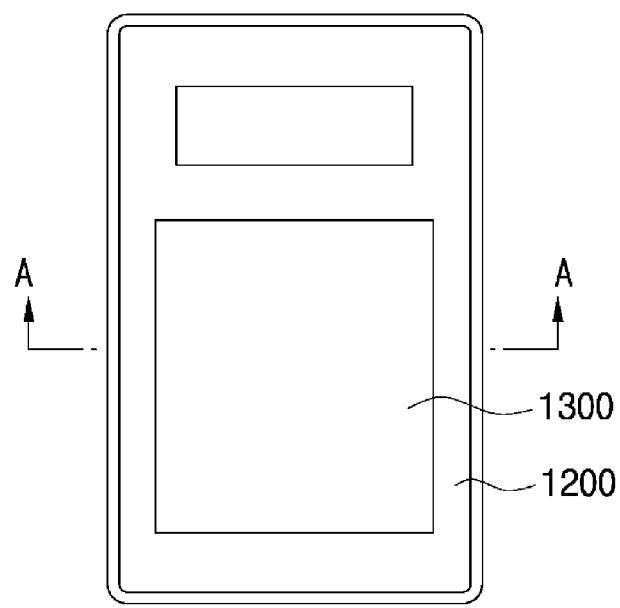
FIG. 4 is a bottom view of a back cover of a portable terminal in which a hybrid insulation sheet according to the present is attached to the back cover of the portable terminal.
Figure 5:
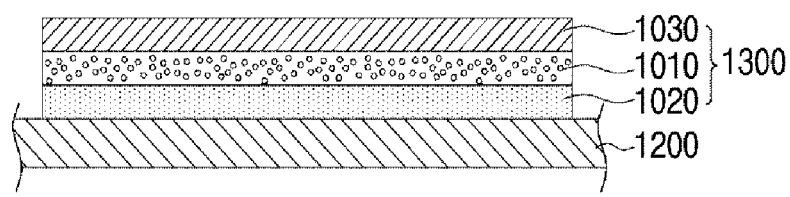
FIG. 5 is an enlarged cross-sectional view taken along a line A-A of FIG. 4.

As shown in FIGS. 3 to 5, a portable terminal 1100 having an insulation sheet according to a first embodiment of the present invention includes: a portable terminal main body 1100; a back cover 1200 that is detachably coupled to the portable terminal main body 1100; and an insulation sheet 1300 that is attached to the inner surface of the back cover 1200 and suppresses heat generated from the portable terminal main body 1100 from being delivered to the outside of the portable terminal 1100 through the back cover 1200.

The electronic apparatuses described in the present invention mean all small portable electronic apparatuses such as mobile phones, smart phones, notebook computers, terminals for digital broadcasting, PDAs (Personal Digital Assistants), PMPs (Portable Multimedia Players), and navigation devices, and large-sized electronic apparatuses including heat generating components such as TV receivers and refrigerators. In particular, the insulation sheets according to the present invention may be used very usefully for the portable terminals causing a heat generation problem.

Various heat generating components such as a battery are built in the inside of the portable terminal main body 1100, to thus generate a lot of heat. If the portable terminal is used for a long time, the heat generated from the portable terminal main body 1100 is transferred to a user's body to thereby inflict burns upon a user or cause discomfort during use.

Since the portable terminal main body 1100 tends to be slimmed, there will be a limitation when the insulation sheet is attached to the inside of the portable terminal main body 1100. Thus, the insulation sheet 1300 is attached to the back cover 1200 in the present invention, and thus the heat generated from the portable terminal main body 1100 is suppressed from being delivered to the body such as the hand through the back cover 1200.

Figure 6:
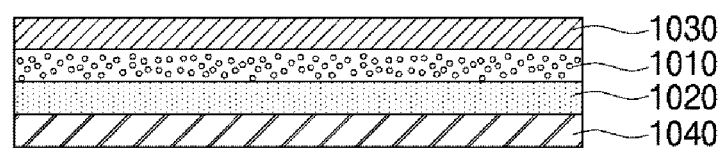
FIG. 6 is an enlarged cross-sectional view of a hybrid insulation sheet according to a first embodiment of the present invention.

As shown in FIGS. 5 and 6, the insulation sheet 1300 includes:

an insulating member 1010 that is formed in a nano-fiber web form having a plurality of fine pores by an electrospinning method; an adhesive member 1020 that is laminated on one surface of the insulating member 1010 so that the insulating member 1010 can be attached to the inner surface of the back cover 1200; a protective film that is laminated on the other surface of the insulating member 1010; and a release member 1040 that is attached to the adhesive member 1020.

Figure 7:
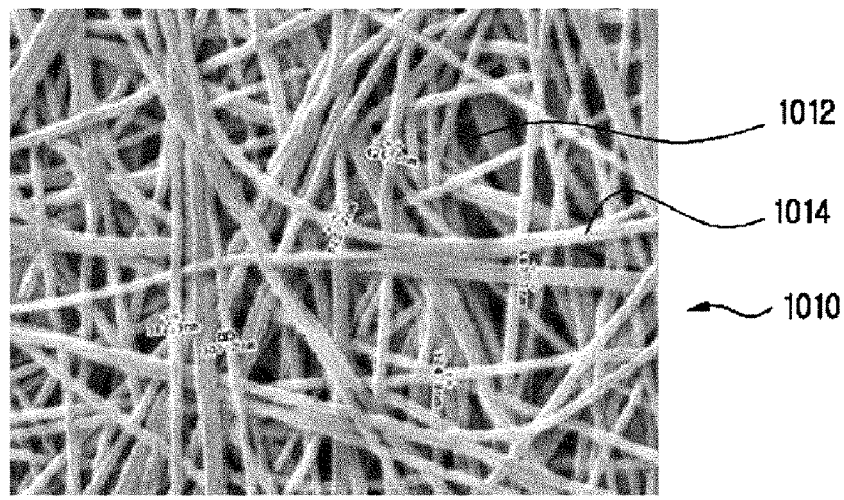
FIG. 7 is an enlarged cross-sectional view showing nanofibers and a fine pore structure of the hybrid insulation sheet according to the first embodiment of the present invention.

The insulating member 1010, as illustrated in FIG. 7, is formed in a nano-fiber web shape having a large number of fine pores 1012 by mixing a polymer material that can be electrospun and having excellent heat resistance with a solvent at a constant ratio to produce a spinning solution, electrospinning the spinning solution to form nano-fibers 1014, and accumulating the nano-fibers 1014.

The smaller the diameters of the nano-fibers 1014, the larger the specific surface areas of the nano-fibers 1014, and the greater the air trap capacity of a nano-fiber web having a large number of fine pores, to thereby improve insulating performance. Thus, a diameter of the nano-fiber 1014 is in the range of 0.3 to 5 μm, and a thickness of the insulating member 1010 is formed in the range of 5 to 30 μm. Further, porosity of the fine pores 1012 formed in the insulating member 1010 is preferably in the range of 50 to 80%.

In general, it is known that air is an excellent insulation material of a low conductivity, but is not used as the insulation material due to convection. However, since the insulation sheet according to the present invention is configured in a web form having a large number of fine pores, air does not convect and is trapped in the fine pores. Accordingly, the insulation sheet according to the present invention can exhibit an excellent insulating property that air itself possesses.

The spinning method that is applied to the present invention, can employ any one selected from electrospinning, air-electrospinning (AES), electrospray, electrobrown spinning, centrifugal electrospinning, flash-electrospinning.

A polymeric material used to make the insulating member 1010 may be made of one of for example, oligomer polyurethane, and polymer polyurethane, PS (polystylene), PVA (polyvinylalchol), PMMA (polymethyl methacrylate), PLA (polylactic acid), PEO (polyethyleneoxide), PVAc (polyvinylacetate), PAA (polyacrylic acid), PCL (polycaprolactone), PAN (polyacrylonitrile), PVP (polyvinylpyrrolidone), PVC (polyvinylchloride), nylon, PC (polycarbonate), PEI (polyetherimide), PVdF (polyvinylidene fluoride), PEI (polyetherimide), PES (polyesthersulphone) or a mixture thereof.

The solvent is at least one selected from the group consisting of DMA (dimethyl acetamide), DMF (N, N-dimethylformamide), NMP (N-methyl-2-pyrrolidinone), DMSO (dimethyl sulfoxide), THF (tetra-hydrofuran), DMAc (dimethylacetamide), EC (ethylene carbonate), DEC (diethyl carbonate), DMC (dimethyl carbonate), EMC (ethyl methyl carbonate), PC (propylene carbonate), water, acetic acid, and acetone.

The insulating member 1010 is prepared by the electrospinning method, and thus thickness of the insulating member 1010 is determined according to a spinning dose of a spinning solution. Accordingly, it is easy to have the insulating member 1010 made into a desired thickness.

As described above, since the insulating member 1010 is formed into a nano-fiber web shape in which nano-fibers 1014 are accumulated by a spinning method, the insulating member 1010 can be made of a type having plurality of fine pores 1012 without a separate process. It is also possible to adjust size of the fine pores according to a spinning dose of a spinning solution. Thus, since the multiple fine pores 1012 can be finely made, heat transfer inhibition performance is excellent, to accordingly improve heat insulation performance.

The adhesive member 1020 is formed in a nano-fiber web shape by mixing an adhesive and a solvent to thus prepare an adhesive material of a viscosity suitable for electrospinning, electrospinning the adhesive material to thus form nano-fibers 1014, and accumulating the nano-fibers 1014.

That is, the adhesive member 1020 may be formed in the same electrospinning method as the method of forming the insulating member 1010. Thus, thickness of the adhesive member 1020 is also determined according to a spinning dose of the adhesive material and thus the thickness of the adhesive member 1020 can be made freely.

The protective film 1030 is provided in order to protect the insulating member 1010, and a single-sided adhesive tape may be preferably used as the protective film 1030. That is, the insulation sheet 1300 according to the present invention is attached to and positioned in the inner surface of the back cover 1200 in the portable terminal. Here, if the insulating member 1010 is in an exposed state, the insulating member 1010 may be damaged, and thus the above-mentioned protective film 1030 is attached to the insulating member 1010 to thereby protect the insulating member 1010.

Meanwhile, the protective film 1030 may be formed by an electrospinning method as in the case of the adhesive member 1020 in addition to the single-sided adhesive tape. In this case, an adhesive material is spun on a separate substrate to thus form an adhesive layer, and then the adhesive layer is attached to the insulating member 1010 so that the substrate is positioned outside.

Here, the adhesive member 1020 and the protective film 1030 may be formed to have a thickness of 1 to 10 μm, preferably to have a thickness of 3 to 5 μm.

The release member 1040 is attached to the adhesive member 1020 before the insulation sheet 1300 is attached to the back cover 1200, to thus protect the adhesive member 1020, in which the release member 1040 is removed to attach the insulation sheet 1300 to the back cover 1200. A resin material such as PET film can be used as the release member 1040. In addition to the resin material, a fiber material is also applied as the release member 1040.

Thus, the insulation sheet 1300 according to the first embodiment of the present invention can slim the thickness, improve the insulating performance, and simplify the manufacturing process, by forming the insulating member 1010, the adhesive member 1020, or the protective film 1030 in a nano-fiber web form, by electrospinning.

Figure 8:
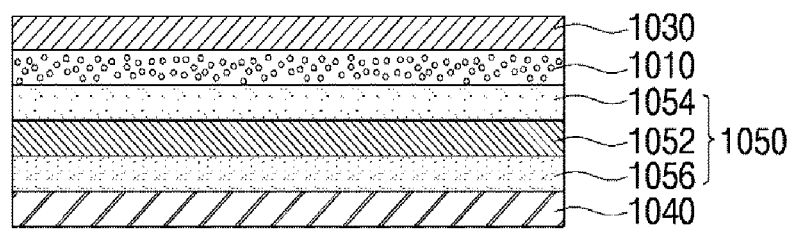
FIG. 8 is an enlarged cross-sectional view showing a first modification of the hybrid insulation sheet according to the first embodiment of the present invention.

As shown in FIG. 8, a first modification of the insulation sheet 1300 according to the first embodiment of the present invention includes: an insulating member 1010 that is formed in a nano-fiber web shape having a plurality of fine pores by way of electrospinning; a double-sided adhesive tape 1050 that is laminated on one surface of the insulating member 1010 so that the insulating member 1010 can be attached to the inner surface of a back cover 1200; a protective film 1030 laminated on the other surface of the insulating member 1010; and a release member 1040 that is attached to the double-sided adhesive tape 1050.

The double-sided adhesive tape 1050 includes: a substrate 1052; a first adhesive layer 1054 that is laminated on one surface of the substrate 1052; and a second adhesive layer 1056 that is laminated on the other surface of the substrate 1052.

The double-sided adhesive tape 1050 may be prepared separately from the insulating member 1010 and laminated on one surface of the insulating member 1010. The double-sided adhesive tape 1050 may be also formed in the same electrospinning method as the method of forming the insulating member 1010.

Figure 9:
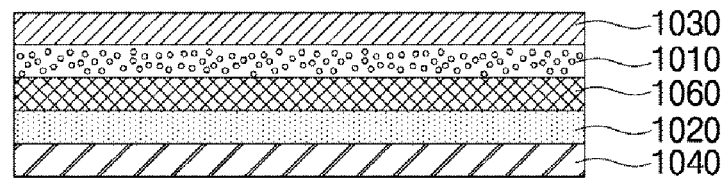
FIG. 9 is an enlarged cross-sectional view showing a second modification of the hybrid insulation sheet according to the first embodiment of the present invention.

As shown in FIG. 9, a second modification of the insulation sheet 1300 according to the first embodiment of the present invention includes: a support member 1060 having a plurality of pores; an insulating member 1010 whose one surface is laminated on one surface of the support member 1060, and formed in a nano-fiber web shape having a plurality of fine pores by way of electro spinning; an adhesive tape 1020 that is laminated on the other surface of the support member 1060 so that the insulating member 1010 can be attached to the inner surface of a back cover 1200; a protective film 1030 laminated on the other surface of the insulating member 1010; and a release member 1040 that is attached to the adhesive tape 1020.

The support member 1060 serves to enhance the strength of the entire insulation sheet 1300 for convenience of handling the insulation sheet. That is, since the insulation sheet 1300 is formed in a nano-fiber web shape by electrospinning, the insulation sheet 1300 is thin. As a result, it is difficult to separate the release member 1040 from the insulation sheet 1300 and attach the insulation sheet 1300 on the back cover 1200. Thus, the support member 1060 is provided in the insulation sheet 1300 to enable the insulation sheet to be attached to the back cover more easily.

The support member 1060 may employ a non-woven fabric having a plurality of pores. In addition to the non-woven fabric, any material formed of numerous pores and capable of supporting the insulating member 1010 can be used as the support member 1060.

The support member 1060 may be formed to have a thickness of about 10 μm to 25 μm.

Figure 10:
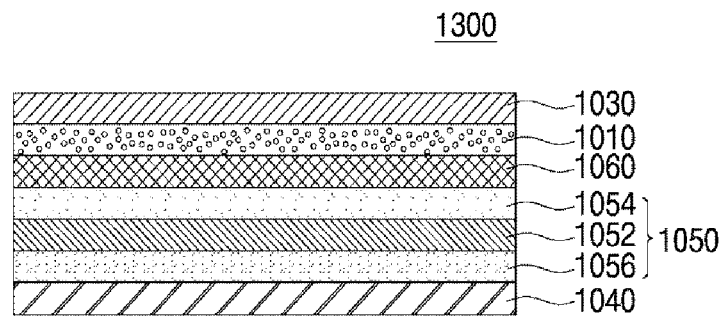
FIG. 10 is an enlarged cross-sectional view showing a third modification of the hybrid insulation sheet according to the first embodiment of the present invention.

As shown in FIG. 10, a third modification of the insulation sheet 1300 according to the first embodiment of the present invention includes: a support member 1060 having a plurality of pores; an insulating member 1010 whose one surface is laminated on one surface of the support member 1060, and formed in a nano-fiber web shape having a plurality of fine pores by way of electrospinning; a double-sided adhesive tape 1050 that is laminated on the other surface of the support member 1060 so that the insulating member 1010 can be attached to the inner surface of a back cover 1200; a protective film 1030 laminated on the other surface of the insulating member 1010; and a release member 1040 that is attached to the double-sided adhesive tape 1050.

The support member 1060 has the same structure as the support member 1060 described in the third embodiment, and the double-sided adhesive tape 1050 has the same structure as the double-sided adhesive tape described in the second embodiment.

An electrospinning apparatus for producing the insulation sheet according to the present invention includes: a mixing tank that stores a spinning solution that is prepared by mixing a polymer material that can be electrospun and has excellent heat resistance with a solvent; a spinning nozzle that is connected with a high voltage generator and the mixing tank, to thus form an insulating layer; and a collector that is disposed at a lower side of the spinning nozzle in which the insulating member is formed.

A high voltage electrostatic force of 90 Kv to 120 Kv is applied between the collector and the spinning nozzle to thereby spin ultra-fine fiber strands and form an ultra-fine nano-fiber web.

A roll for supplying a release member or a support member for the collector is provided at the front side of the collector. A pressing roller that presses (or calenders) an insulating member formed while passing through the collector to have a predetermined thickness and a roll around which an insulation sheet that is pressed while passing through the pressing roller is wound are provided at the rear side of the collector.

A process of manufacturing insulation sheets according to the first embodiment of the present invention by using the above-described electrospinning apparatus will be described below.

Figure 11:
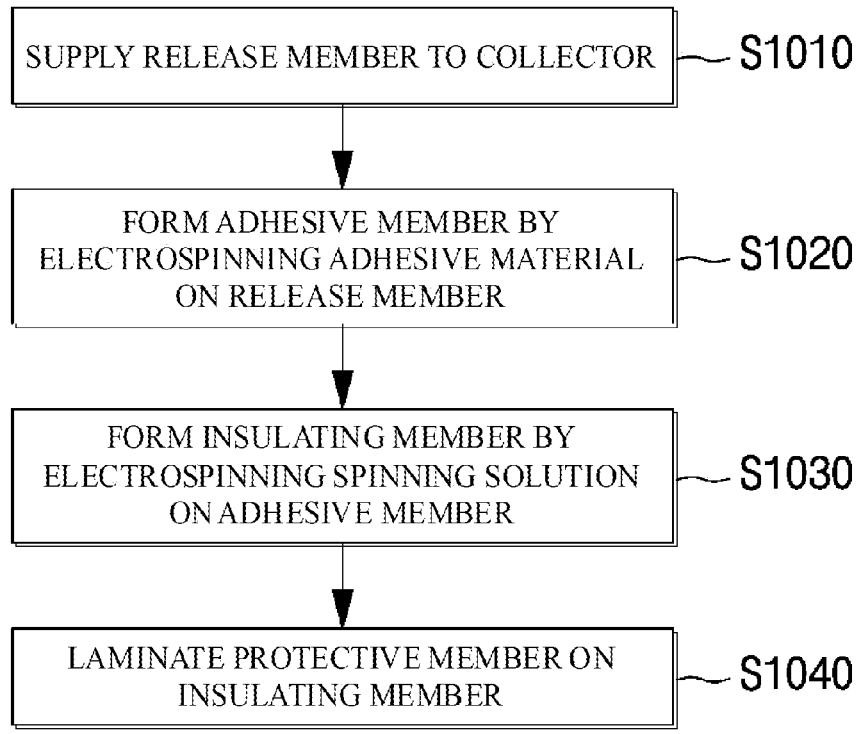
FIG. 11 is a flowchart view showing a manufacturing process of the hybrid insulation sheet according to the first embodiment of the present invention.

As shown in FIG. 11, an insulation sheet manufacturing process according to the first embodiment of the present invention is manufactured according to the following procedures. First, a release member is supplied for the collector (S1010).

Then, by applying the high voltage electrostatic force between the collector and the spinning nozzle, the adhesive material is made into ultra-fine fiber strands through the spinning nozzle to then be spinned to the release film. Then, the ultra-fine fiber strands are accumulated on the surface of the release film, and thus an adhesive member is formed in the form of a non-pore nano-fiber web (S1020).

Then, the spinning solution is electrospun on the adhesive member, and thus an insulating member having a plurality of fine pores is formed in a nano-fiber web shape (S1030).

Thus, an insulation sheet including the adhesive member and the insulating member is pressed into a predetermined thickness while passing through the pressing roller, to then be wound on a sheet roll.

Then, a protective film is laminated on one surface of the insulating member, to thereby completely prepare the insulation sheet (S1040).

The process of manufacturing an insulation sheet according to a first modification of the first embodiment of the present invention includes: forming an insulating member by using an electrospinning apparatus; laminating a double-sided adhesive tape on one surface of the insulating member; and laminating a protective film on the other surface of the insulating member, to thereby complete the insulation sheet.

Here, the double-sided adhesive tape can be manufactured integrally with the insulating member by using the electrospinning apparatus.

Figure 12:
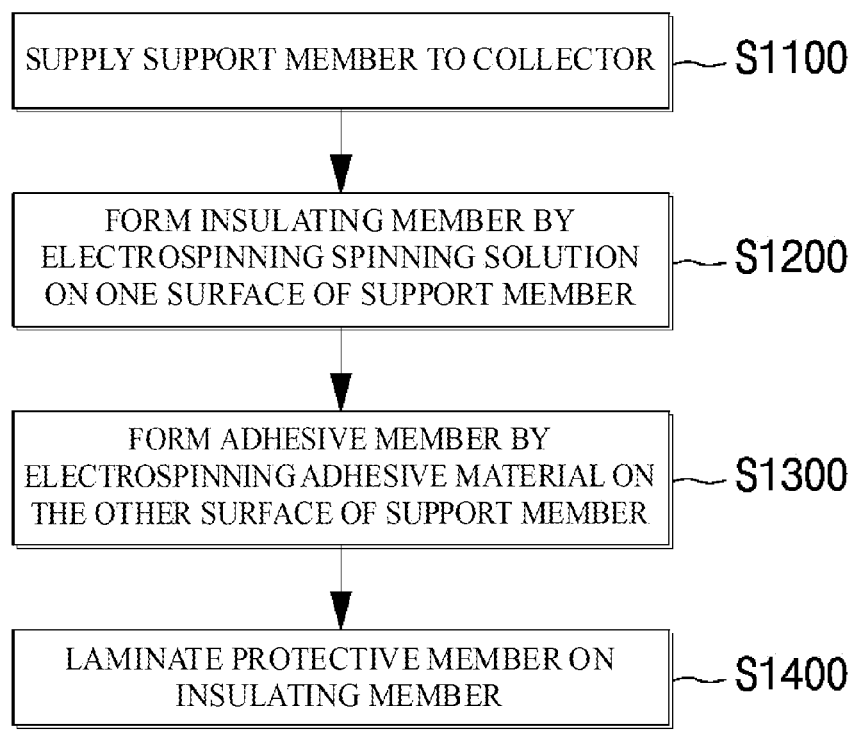
FIG. 12 is a flowchart view showing another manufacturing process of the hybrid insulation sheet according to the first embodiment of the present invention.

As shown in FIG. 12, an insulation sheet according to a second modification of the first embodiment of the present invention is manufactured according to the following procedures. First, a support member is supplied for the collector (S1100).

Then, by applying the high voltage electrostatic force between the collector and the spinning nozzle, the spinning solution is made into ultra-fine fiber strands through the spinning nozzle to then be spinned on one surface of the support member. Then, the ultra-fine fiber strands are accumulated on the surface of the support member, and thus an insulating member having a plurality of fine pores is formed in the form of a nano-fiber web (S1200).

Then, the adhesive material is electrospun on the other surface of the support member, and thus an adhesive member is formed in a non-pore nano-fiber web shape (S1300).

Then, a protective film is laminated on the insulating member, to thereby completely manufacture the insulation sheet (S1400).

Here, in the case of forming the insulating member and the adhesive member, the adhesive member may be formed at first and then the insulating member may be formed. Further, the heat insulating member and the adhesive member may be separately prepared and then the two members may be laminated on each other.

The process of manufacturing an insulation sheet according to a third modification of the first embodiment of the present invention includes: forming an insulating member by using an electrospinning apparatus; laminating a double-sided adhesive tape on one surface of the insulating member;

and laminating a protective film on the other surface of the insulating member, to thereby complete the insulation sheet.

The insulation sheet according to the first embodiment of the present invention can be implemented in a structure that the insulating member is the insulating layer, the radiating layer can be bonded on the other surface of the insulating member, and the protective film is laminated on the radiating layer.

Figure 13:
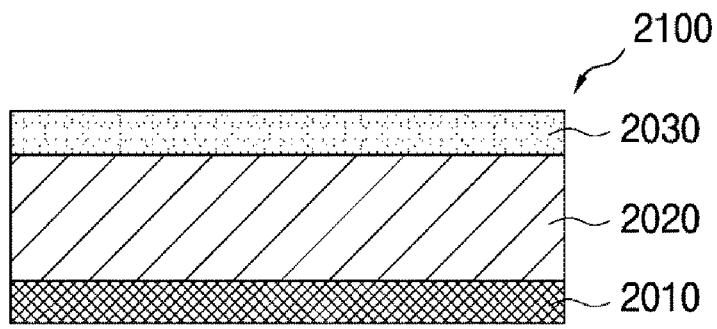
FIG. 13 is an enlarged cross-sectional view of a hybrid insulation sheet according to a second embodiment of the present invention.

As shown in FIG. 13, an insulation sheet 2100 according to a second embodiment of the present invention includes: a radiating layer 2020 that spreads heat in the horizontal direction; an insulating layer 2010 that is laminated on one surface of the radiating layer 2020 to thereby suppress heat from being delivered in the vertical direction; and an adhesive layer 2030 that is laminated on the other surface of the radiating layer 2020.

The radiating layer 2020 is formed of a metal having an excellent thermal conductivity, e.g., one of Al and Cu, or an alloy thereof, preferably Cu having an excellent thermal conductivity.

The radiating layer 2020 rapidly spreads heat generated from a heat generating component in the horizontal direction and prevents the heat generating component from being locally highly heated to thus prevent the heat generating component and the other components from being damaged by the heat.

Any materials that can rapidly spread heat in the horizontal direction can be applied as the radiating layer 2020, other than the heat conductive metal.

The insulating layer 2010 is formed of a porous thin film that can suppress heat that is transferred in the vertical direction. As an example, a nano-fiber web form having a plurality of pores, a non-woven fabric having a plurality of pores, and PES (polyether sulfone) may be used as the insulating layer 2010 by an electrospinning method. It is also possible to use a laminated structure thereof. Further, any materials having a number of pores and capable of performing an insulating function in the vertical direction can be applied as the insulating layer 2010. Here, the pore size of the insulation layer 2010 is preferably several tens of nm up to 5 μm.

In the case that the insulating layer 2010 is made in a nano-fiber web form, the insulating member 2010 having a large number of pores is formed in a nano-fiber web shape by mixing a polymer material that can be electrospun and having excellent heat resistance with a solvent at a constant ratio to produce a spinning solution, electrospinning the spinning solution to form nano-fibers, and accumulating the nano-fibers.

As described above, since the insulating member 2010 is formed into a nano-fiber web shape in which nano-fibers are accumulated by a spinning method, the insulating member 2010 can be made of a type having plurality of pores without a separate process. It is also possible to adjust size of the pores according to a spinning dose of a spinning solution. Thus, since the multiple fine pores can be finely made, heat transfer inhibition performance is excellent, to accordingly improve heat insulation performance.

Here, as the insulation layer 2010 becomes thick, the insulation performance may be improved, and as the radiating layer 2020 becomes thick, thermal diffusion performance may be improved. Thus, according to the mounting locations of the insulating layer 2010 and the radiating layer 2020, the thicknesses of the insulating layer 2010 and the radiating layer 2020 are adjusted to thus realize optimal performance.

The adhesive layer 2030 is formed of an adhesive material having a thermal conductivity so that heat generated from a heat generating component can be quickly delivered to the radiating layer 2020. For example, the adhesive layer may employ a conventional thermal conductive adhesive tape or thermal conductive adhesive sheet. In addition, the adhesive layer may be formed into a non-pore nano-web form by electrospinning.

In the case that the adhesive layer 2030 is made in a non-pore nano-fiber web form, the adhesive layer 2030 is formed in the following procedure. First, a thermal conductive and electrical conductive adhesive material is made by mixing a thermally conductive metal of Al, Ni, Cu, or Ag having an excellent thermal conductivity, at least one adhesive agent selected from a carbon black, a carbon nano-tube, graphene, and a conducting polymer (PDOT), and a solvent, to then prepare the adhesive material having a viscosity suitable for electrospinning. Then, the adhesive material is electrospun to create nano-fibers, and the nano-fibers are accumulated, to thereby prepare the adhesive layer 2030 in a non-pore nano-fiber web form.

That is, the adhesive member 2030 may be formed in the same electrospinning method as the method of forming the insulating layer 2010. Thus, thickness of the adhesive layer 2030 is also determined according to a spinning dose of the adhesive material and thus the thickness of the adhesive member 2030 can be made freely.

Then, the adhesive layer 2030 may be also laminated on the insulating layer 2010, and thus can be applied in a structure where the adhesive layer is provided on either side of the insulation sheet.

As described above, the insulation sheet according to the second embodiment is attached to the heat generating component or the other components adjacent to the heat generating component, to thus quickly spread the heat generated from the heat generating component in the horizontal direction through the radiating layer 2020, to thereby prevent the heat generating component from being locally highly heated, and to thus make the insulating layer 2010 perform an insulating function in the vertical direction to thereby suppress the heat generated from the heat generating component from being delivered to the other components.

Figure 14:
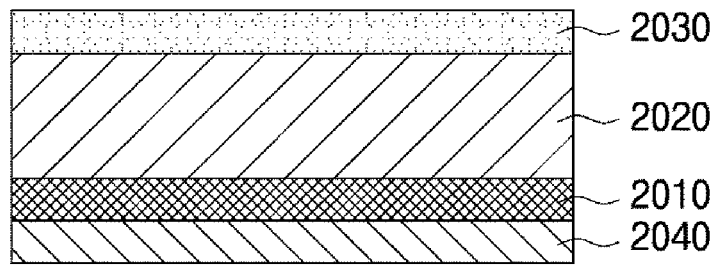
FIG. 14 is an enlarged cross-sectional view showing a first modification of the hybrid insulation sheet according to the second embodiment of the present invention.

FIG. 14 is an enlarged cross-sectional view showing a first modification of the hybrid insulation sheet according to the second embodiment of the present invention.

The first modification of the insulation sheet according to the second embodiment of the present invention includes: a radiating layer 2020 that spreads heat in the horizontal direction; an insulating layer 2010 that is laminated on one surface of the radiating layer 2020 to thereby suppress heat from being delivered in the vertical direction; an adhesive layer 2030 that is laminated on the other surface of the radiating layer 2020; and a protective film 2040 that is laminated on one surface of the insulating layer 2010 to thus protect the insulation layer 2010.

The protective film 2040 is attached to the insulating layer 2010 to thus seal one surface of the insulating layer and to thereby enable the pores to act as an air chamber and at the same time to prevent an external impact or other foreign matters from being introduced through the pores of the insulating layer 2010.

The protective film 2040 may be implemented by using a resin material such as a PET film. In addition, a fiber material is also used as the protective film 2040 in addition to the resin material.

Figure 15:
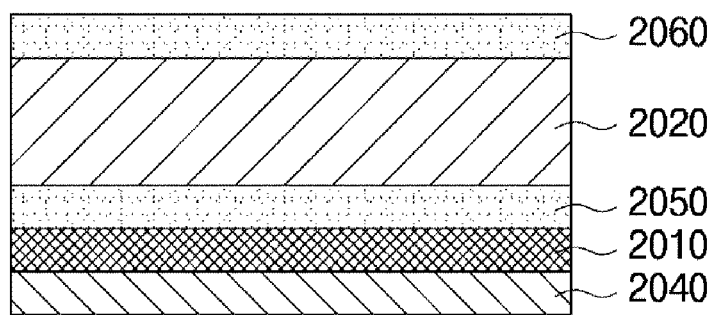
FIG. 15 is an enlarged cross-sectional view showing a second modification of the hybrid insulation sheet according to the second embodiment of the present invention.

FIG. 15 is an enlarged cross-sectional view showing a second modification of the hybrid insulation sheet according to the second embodiment of the present invention.

The second modification of the insulation sheet according to the second embodiment of the present invention includes:

a radiating layer 2020 that spreads heat in the horizontal direction; a first adhesive layer 2050 that is laminated on one surface of the radiating layer 2020; a second adhesive layer 2060 that is laminated on the other surface of the radiating layer 2020; an insulating layer 2010 that is laminated on one surface of the first adhesive layer 2050 to thereby suppress heat from being delivered in the vertical direction; and a protective film 2040 that is laminated on one surface of the insulating layer 2010 to thus protect the insulation layer 2010.

Here, the first adhesive layer 2050 plays a role of attaching the insulating layer 2010 to the radiating layer 2020, and may be formed in a non-pore nano-web type by electrospinning.

Then, the second adhesive layer 2060 plays a role of attaching the insulation sheet 2100 to the heat generating component, and is the same as the adhesive layer 2030 described in the first embodiment.

Figure 16:
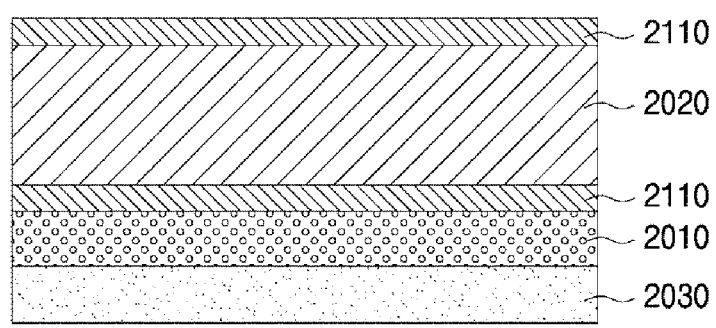
FIG. 16 is an enlarged cross-sectional view showing a third modification of the hybrid insulation sheet according to the second embodiment of the present invention.

FIG. 16 is an enlarged cross-sectional view showing a third modification of the hybrid insulation sheet according to the second embodiment of the present invention.

The third modification of the insulation sheet according to the second embodiment of the present invention includes: a radiating layer 2020 that spreads heat in the horizontal direction; an insulating layer 2010 that is laminated on one surface of the radiating layer 2020 to thereby suppress heat from being delivered in the vertical direction; an adhesive layer 2030 that is laminated on the other surface of the radiating layer 2020; and an oxidation preventing film 2110 that is located between the radiating layer 2020 and the insulating layer 2010 and that is formed on the surface of the radiating layer 2020, to thereby prevent the radiating layer 2020 from being oxidized.

The oxidation preventing film 2110 prevents the radiating layer 2020 from being oxidized in the case that an oxidizable material such as Cu is used as the radiating layer 2020, and may be formed by coating an oxidation preventing material on the surface of the radiating layer 2020, in which the surface of the radiating layer 2020 is oxidized to thus form an oxide film.

Here, Ni can be used as the oxidation preventing material, and specifically Ni is coated on the surface of the radiating layer 2020 with a thickness of about 0.2 μm.

As described above, the insulation sheet according to the third modification of the second embodiment of the present invention employs a structure that the oxidation preventing film 2110 is formed on the surface of the radiating layer 2020 to thus prevent the radiating layer 2020 from being oxidized and prevent the radiating layer 2020 from being degraded by oxidation.

Figure 17:
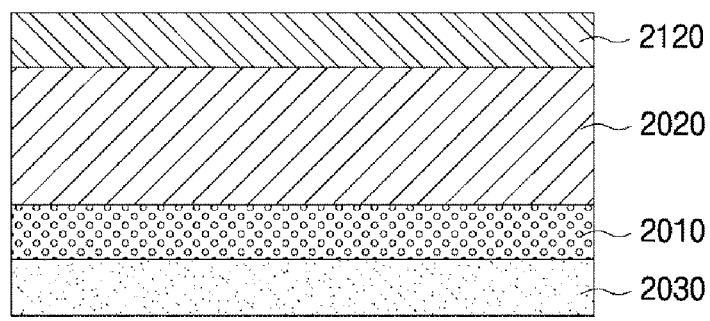
FIG. 17 is an enlarged cross-sectional view showing a fourth modification of the hybrid insulation sheet according to the second embodiment of the present invention.

FIG. 17 is an enlarged cross-sectional view showing a fourth modification of the hybrid insulation sheet according to the second embodiment of the present invention.

The fourth modification of the insulation sheet according to the second embodiment of the present invention includes: a radiating layer 2020 that spreads heat in the horizontal direction; an insulating layer 2010 that is laminated on one surface of the radiating layer 2020 to thereby suppress heat from being delivered in the vertical direction; an adhesive layer 2030 that is laminated on one surface of the insulating layer 2010; and an electrically conductive adhesive layer 2120 that is laminated on one surface of the radiating layer 2020, to thereby absorb electromagnetic waves.

The electrically conductive adhesive layer 2120 can be formed in the same electrospinning apparatus as the insulating layer 2010. The electrically conductive adhesive layer 2120 can be attached on one surface of the radiating layer 2020.

In the case that the electrically conductive adhesive layer 2120 is formed by using the electrospinning apparatus, the electrically conductive adhesive layer 2120 is formed in a non-pore nano-fiber web shape by mixing a polymer material that can be electrospun, an electrically conductive adhesive material, and a solvent at a constant ratio to produce a spinning solution, electrospinning the spinning solution to form nano-fibers, and accumulating the nano-fibers.

As described above, the insulation sheet according to the fourth modification of the second embodiment of the present invention is provided with the electrically conductive adhesive layer 2120, thereby absorbing the electromagnetic waves and thus playing a role of shielding electromagnetic waves.

Figure 18:
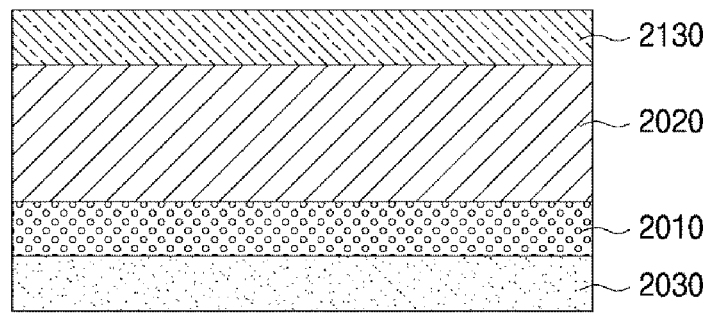
FIG. 18 is an enlarged cross-sectional view showing a fifth modification of the hybrid insulation sheet according to the second embodiment of the present invention.

FIG. 18 is an enlarged cross-sectional view showing a fifth modification of the hybrid insulation sheet according to the second embodiment of the present invention.

The fifth modification of the insulation sheet according to the second embodiment of the present invention includes: a radiating layer 2020 that spreads heat in the horizontal direction; an insulating layer 2010 that is laminated on one surface of the radiating layer 2020 to thereby suppress heat from being delivered in the vertical direction; an adhesive layer 2030 that is laminated on one surface of the insulating layer 2010; and a color cover layer 2130 that is laminated on one surface of the radiating layer 2020, and has a variety of colors.

As described above, the insulation sheet according to the fifth modification of the second embodiment of the present invention is used in a portion that is exposed to the outside, the color cover layer 2130 having various colors is provided in the portion that is exposed to the outside of the insulation sheet, to thus beautify design of a product to which the insulation sheet is applied.

The color cover layer 2130 can be formed by coating a color material on the surface of the radiating layer 2020. Otherwise, a single-sided adhesive tape having a colored surface can be used on the surface of the radiating layer 2020.

Figure 19:
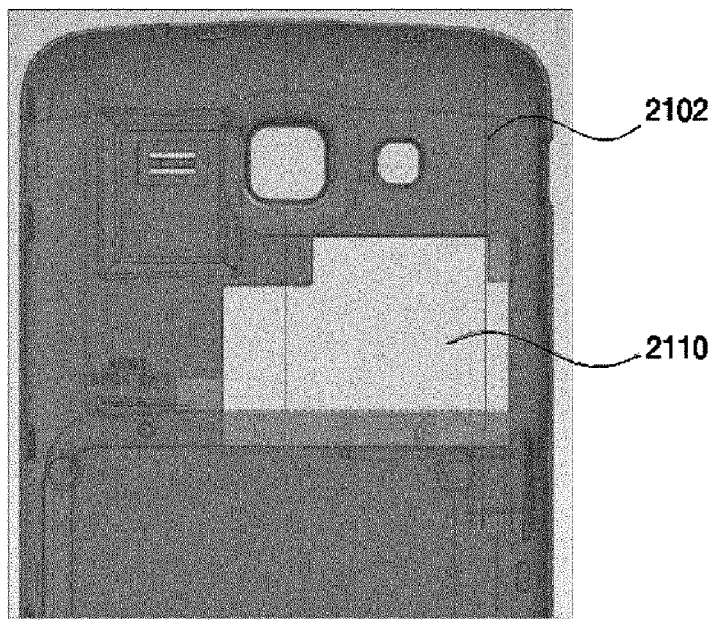
FIG. 19 is an enlarged cross-sectional view showing a cover to which the fourth modification of the hybrid insulation sheet according to the second embodiment of the present invention is attached.

For example, as shown in FIG. 19, in the case that an insulation sheet 2110 is attached to the inner surface of a cover 2102, the cover 2102 is detached from a main body, and thus the inner surface of the cover 2102 is exposed to the outside. Thus, the color cover layer 2130 is formed in the same color as the cover 2102, in the same manner that the color cover layer 2130 is formed in the white color in the case that the color of the cover 2102 is white, and the color cover layer 2130 is formed in the black color in the case that the color of the cover 2102 is black.

Figure 20:
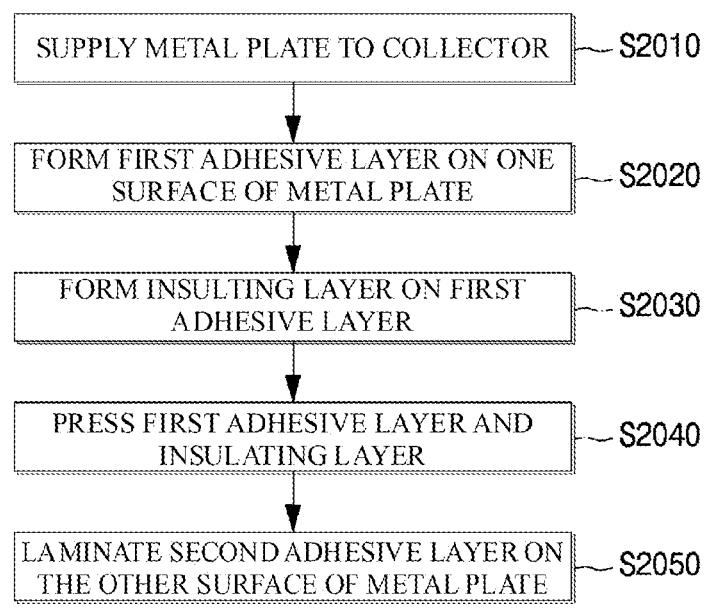
FIG. 20 is a flowchart view showing an example of a manufacturing process of the hybrid insulation sheet according to the second embodiment of the present invention.

FIG. 20 is a flowchart view showing an example of a manufacturing process of the hybrid insulation sheet according to the second embodiment of the present invention.

First, if a collector is driven, a metal plate wound around a roll is fed to the collector (S2010).

Then, a high voltage electrostatic force is applied between the collector and a first spinning nozzle and thus a conductive adhesive material is made into nano-fibers in the spinning nozzle, to then spin the nano-fibers on the surface of a metal plate. In this case, the nano-fibers are accumulated on the surface of the metal plate, to thus from a first adhesive layer (S2020).

Here, when the nano-fibers are spinned in an air injection apparatus that is mounted in the first spinning nozzle, air is injected onto the nano-fibers so that the nano-fibers do not blow and may be collected and integrated on the surface of the metal plate.

Then, if the collector is driven, the metal plate on which the first adhesive layer is laminated is moved to the lower side of a second spinning nozzle, and a spinning solution is made into nano-fibers in the second spinning nozzle to then be spinned on the surface of the first adhesive layer. Then, the nano-fibers are accumulated on the surface of the first adhesive layer, to thereby form an insulation layer having a plurality of pores (S2030).

In addition, a sheet in which the first adhesive layer and the insulating layer are laminated on the surface of the metal plate is pressed into a predetermined thickness while passing through a pressing roller, to then be wound on a sheet roll (S2040).

Then, a second adhesive layer is attached on the other surface of the metal plate, to thereby completely prepare the insulation sheet (S2050).

Here, the second adhesive layer may be separately prepared and attached to the other surface of the metal plate. In addition, the second adhesive layer may be formed into a nano-fiber web form by spinning the nano-fibers on the other surface of the metal plate by using the electrospinning apparatus.

Figure 21:
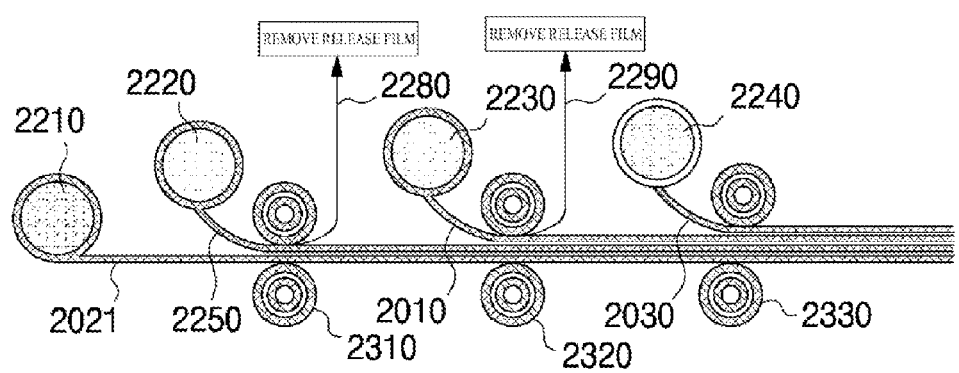
FIG. 21 is a configurational view showing another example of a manufacturing process of the hybrid insulation sheet according to the second embodiment of the present invention.

FIG. 21 is a configurational view showing another example of a manufacturing process of the hybrid insulation sheet according to the second embodiment of the present invention.

The insulation sheet manufacturing process includes: separately preparing a metal plate 2021 that makes up a radiating layer 2020, an insulating layer 2010, and an adhesive layer 2030; and then thermally laminating the metal plate 2021, the insulating layer 2010, and the adhesive layer 2030.

Specifically, the metal plate 2021 is supplied from a metal plate roll 2210, and a hot melt hot melt film 2250 supplied from a hot melt film roll 2220 is laminated on the surface of the metal plate 2021, to then pass through a first pressing roller 2310. Thus, the hot melt hot melt film 2250 is thermally laminated on the surface of the metal plate 2021.

Here, a release film 2280 attached to the hot melt film is removed.

Then, an insulating layer 2010 supplied from an insulating layer roll 2230 is laminated on the surface of the hot melt film 2250 to then pass through a second pressing roller 2320. In this case, the metal plate 2021 and the insulating layer 2010 are thermally laminated by the hot melt film 2250.

Here, a release film 2290 attached to the insulation layer 2010 is removed.

Then, an adhesive layer 2030 supplied from an adhesive layer roll 2240 is laminated on the surface of the insulating layer 2010, to then pass through a third pressing roller 2330. Then, the adhesive layer 2030 is thermally laminated on the surface of the insulating layer 2010.

Figure 22:
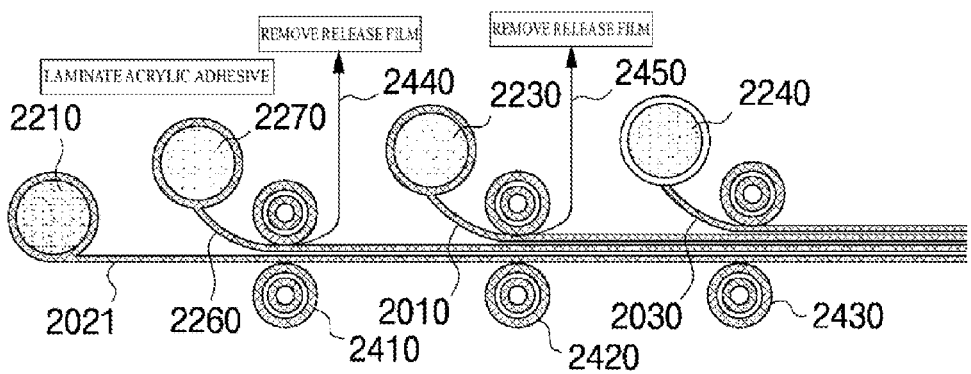
FIG. 22 is a configurational view showing still another example of a manufacturing process of the hybrid insulation sheet according to the second embodiment of the present invention.

FIG. 22 is a configurational view showing still another example of a manufacturing process of the hybrid insulation sheet according to the second embodiment of the present invention.

The insulation sheet manufacturing process is a cold lamination method that can reduce costs compared to the above-described thermal lamination.

Specifically, a metal plate 2021 is supplied from a metal plate roll 2210, and an acrylic adhesive 2260 supplied from an acrylic adhesive roll 2270 is laminated on the surface of the metal plate 2021, to then be cold laminated while passing through a first pressing roller 2410.

In this case, the first pressing roller 2410 employs a roller to which heat is not applied but pressure is applied. Then, a release film 2440 attached to the acrylic adhesive 2260 is removed.

Then, an insulating layer 2010 supplied from an insulating layer roll 2230 is laminated on the surface of an acrylic adhesive 2250 to then pass through a second pressing roller 2320. In this case, the metal plate 2021 and the insulating layer 2010 are cold laminated by the acrylic adhesive.

Here, a release film 2450 attached to the insulation layer 2010 is removed.

Then, an adhesive layer 2030 supplied from an adhesive layer roll 2240 is laminated on the surface of the insulating layer 2010, to then pass through a third pressing roller 2330. Then, the adhesive layer 2030 is cold laminated on the surface of the insulating layer 2010.

Figure 23:
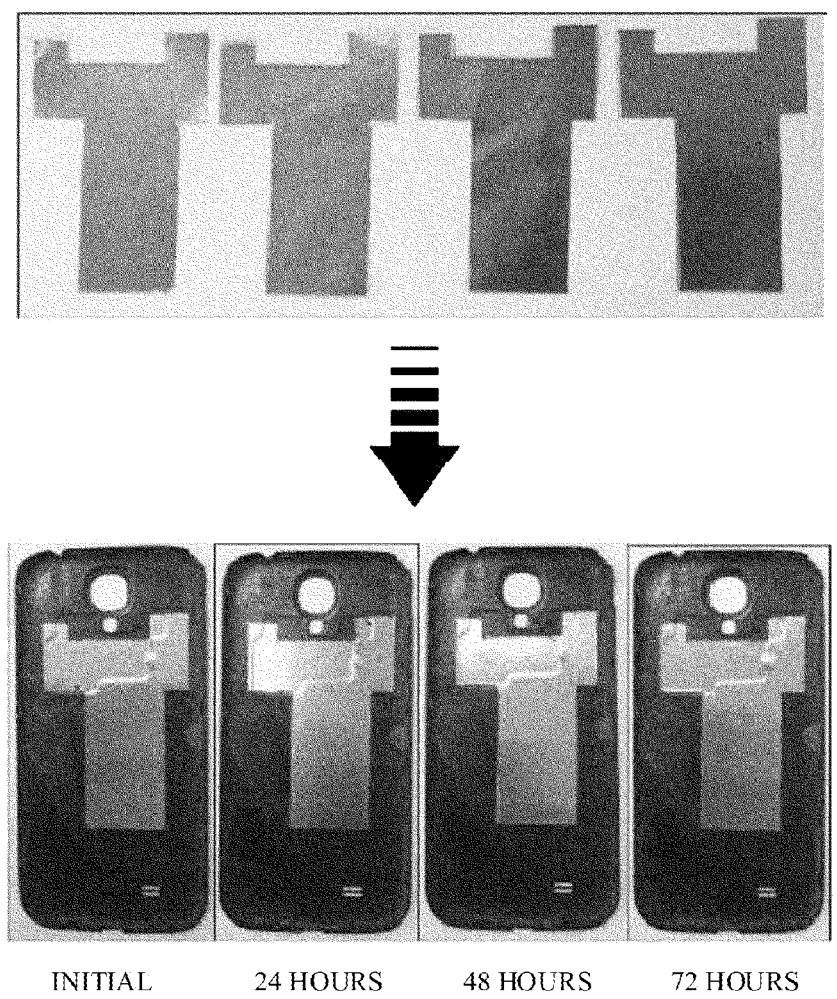
FIG. 23 is a picture to observe whether or not there occur changes in thermal characteristics over time of the hybrid insulation sheet according to the second embodiment of the present invention.
Figure 24:
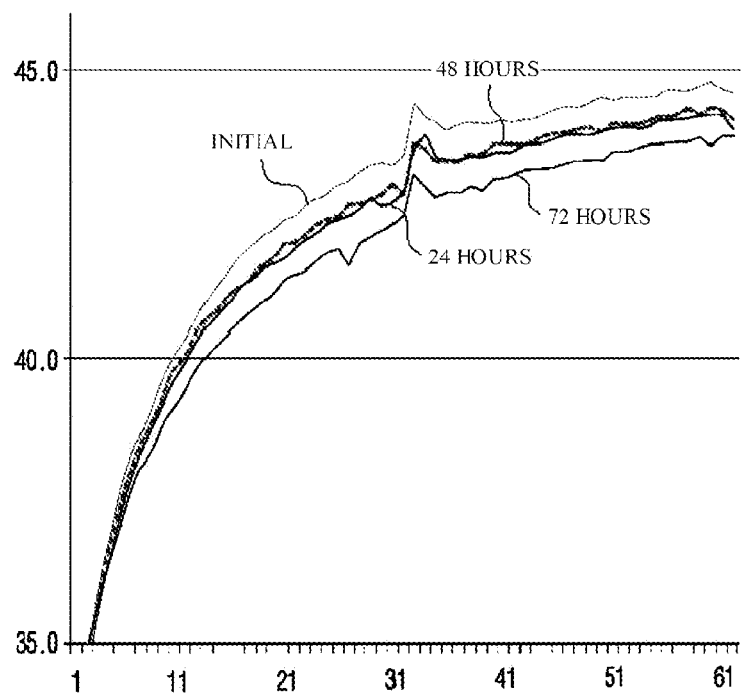
FIG. 24 is a graph showing results that are obtained by comparing radiating characteristics over time of the hybrid insulation sheet according to the second embodiment of the present invention.

FIG. 23 is a picture to observe whether or not there occur changes in thermal characteristics over time of the hybrid insulation sheet according to the second embodiment of the present invention, and FIG. 24 is a graph showing results that are obtained by comparing radiating characteristics over time of the hybrid insulation sheet according to the second embodiment of the present invention.

First, as shown in FIG. 23, a thermal imaging test was performed after leaving the insulation sheet for 24 hours, 48 hours, and 72 hours under the high temperature and high humidity environmental conditions (85° C., and 85% Relative Humidity (RH)), and then it was observed whether or not there occur changes in thermal characteristics according to the surface oxidation.

Here, it was confirmed that a copper plate that forms a radiating layer of an insulation sheet was oxidized according to lapse of time.

Then, the following Table 1 illustrates a change in the surface resistance over time. The surface resistance changes over time. An initial surface resistance is 6.7 Ω/sq. It can be seen that the surface resistance is 12.1 Ω/sq according to lapse of 72 hours.

TABLE 1

| (Reference: 1 Ω/sq or less) | |
|---|---|
| 85° C., 85% RH | MΩ/sq |
| Initial | 6.7 |
| 24 hours | 10.1 |
| 48 hours | 10.8 |
| 72 hours | 12.1 |

Thus, in the case that the oxidation preventing layer is formed on the surface of the radiating layer, oxidation of the copper plate can be prevented.

Then, as shown in the graph shown in FIG. 24, although the copper plate is oxidized over time, it can be confirmed that there was little change in thermal characteristics, i.e., in the radiating characteristics.

Figure 25:
FIG. 25 are pictures showing thermal images over time of the hybrid insulation sheet according to the second embodiment of the present invention.
Figure 25:
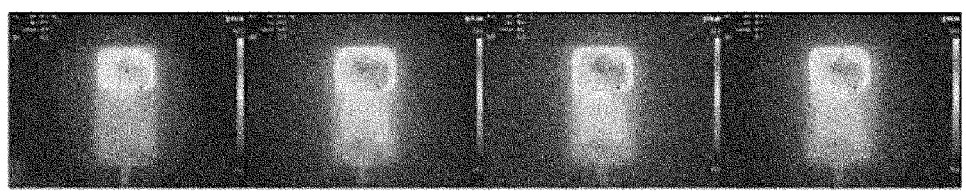

FIGS. 25A and 25B are pictures showing thermal images over time of the hybrid insulation sheet according to the second embodiment of the present invention.

As shown in FIG. 25A, when thermal imaging photos were taken after leaving the insulation sheet for 24 hours, 48 hours, and 72 hours under the high temperature and high humidity environmental conditions (85° C., and 85% Relative Humidity (RH)), and a thermal imaging photo after lapse of initial 30 minutes and a thermal imaging photo after lapse of 30 minutes after leaving the insulation sheet alone for 72 hours were compared with each other, it can be confirmed that there was little change in thermal characteristics.

Likewise, as shown in FIG. 25B, although a thermal imaging photo after lapse of initial 60 minutes and a thermal imaging photo after lapse of 60 minutes after leaving the insulation sheet alone for 72 hours were compared with each other, it can be confirmed that there was little change in thermal characteristics.

Figure 26:
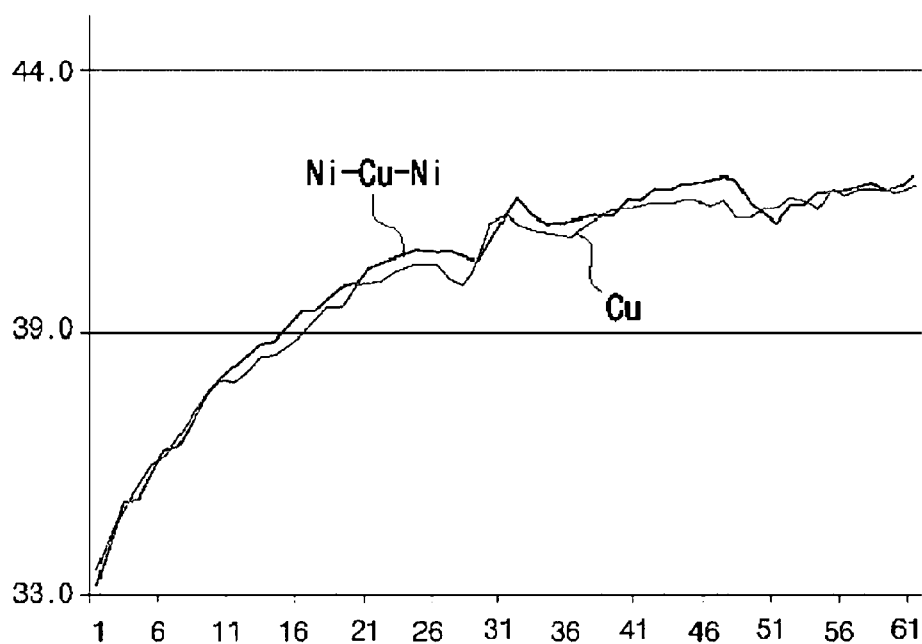
FIG. 26 is a graph showing results that are obtained by comparing radiating characteristics of a pure copper plate and a Ni-coated copper plate for oxidation of the copper plate of the hybrid insulation sheet according to the second embodiment of the present invention.

FIG. 26 is a graph showing results that are obtained by comparing radiating characteristics of a pure copper plate and a Ni-coated copper plate for oxidation of the copper plate of the hybrid insulation sheet according to the second embodiment of the present invention, and FIGS. 27A to 27D are pictures showing thermal images over time of a pure copper plate and a Ni-coated copper plate for oxidation of the copper plate of the hybrid insulation sheet according to the second embodiment of the present invention.

As shown in FIG. 26, it can be confirmed that there was little change in radiating characteristics between a pure copper plate and a Ni-coated copper plate for oxidation of the copper plate.

Figure 27:
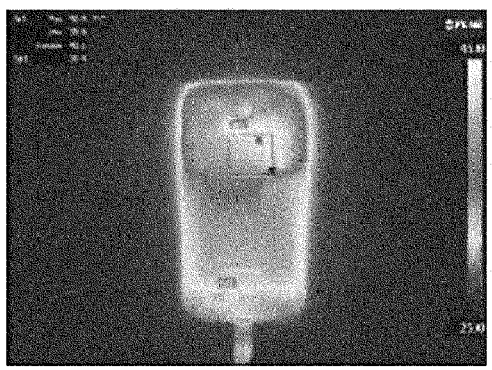
FIG. 27 are pictures showing thermal images over time of a pure copper plate and a Ni-coated copper plate for oxidation of the copper plate of the hybrid insulation sheet according to the second embodiment of the present invention.
Figure 27:
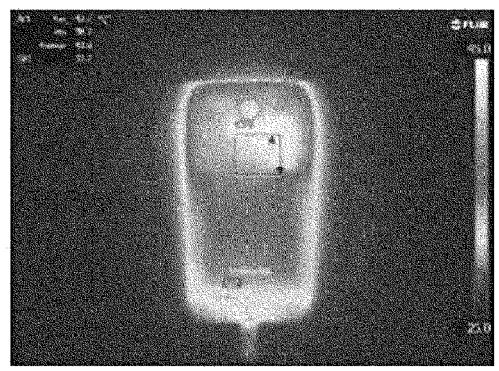
Figure 27:
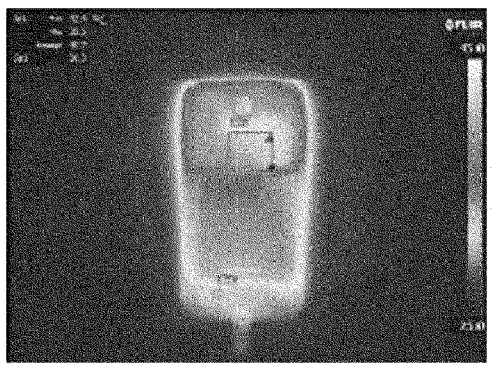
Figure 27:
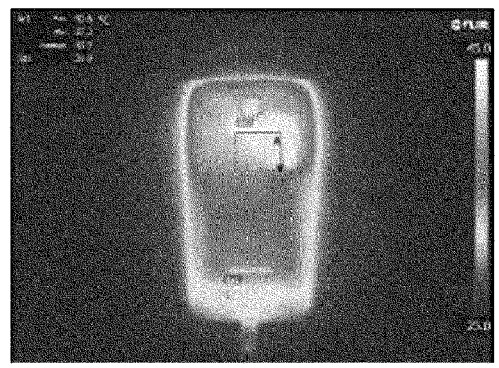

In addition, as shown in FIGS. 27A and 27B, when a thermal image photo after lapse of 30 minutes (FIG. 27A) and a thermal image photo after lapse of 60 minutes (FIG. 27B) are compared with each other in the case of using a pure copper plate, it can be confirmed that there was little change in thermal characteristics. Likewise, as shown in FIGS. 27C and 27D, when a thermal image photo after lapse of 30 minutes (FIG. 27C) and a thermal image photo after lapse of 60 minutes (FIG. 27D) are compared with each other in the case of using a Ni-coated copper plate, it can be confirmed that there was little change in thermal characteristics.

In the present invention, the insulating layer can be realized in a dual structure. In other words, the insulating layer is configured to include: a first insulating layer that becomes an air pocket in which air is trapped to suppress the thermal convection and to insulate heat; and a second insulating layer that is laminated on one surface of the first insulating layer to suppress heat delivered in the vertical direction. Here, the first insulating layer is made of a porous substrate, and the second insulating layer is made of graphite.

In the present invention, in order to improve the thermal emissivity, the insulation sheet further includes a thin film that is laminated on the radiating layer. The thin film is made of one selected from a coating film containing a graphene powder, a graphene thin film, and a film on which a nano-sol is coated, gelated, and heat treated in which radiating particles are dispersed in the nano-sol.

Here, the film on which a nano-sol is coated, gelated, and heat treated in which radiating particles are dispersed in the nano-sol, is a ceramic coating film that is formed by coating the nano-sol in which radiating particles are dispersed on the radiating layer, and drying the nano-sol coated radiating layer, to thereby form a gelation film and to then be heat treated. The coating film containing a graphene powder is formed by coating a binder mixed with the graphene powder on the radiating layer by using a spray coating method, a dip coating method, or a roll coating method. The graphene thin film refers to a thin film made of pure grapheme that does not contain a heterogeneous material such as a binder.

In the present invention, irregularities such as microdimples are formed on the surface of the radiating layer, to thereby increase a contact area with the air and to improve efficiency of radiating heat in the radiating layer to the outside.

Figure 28:
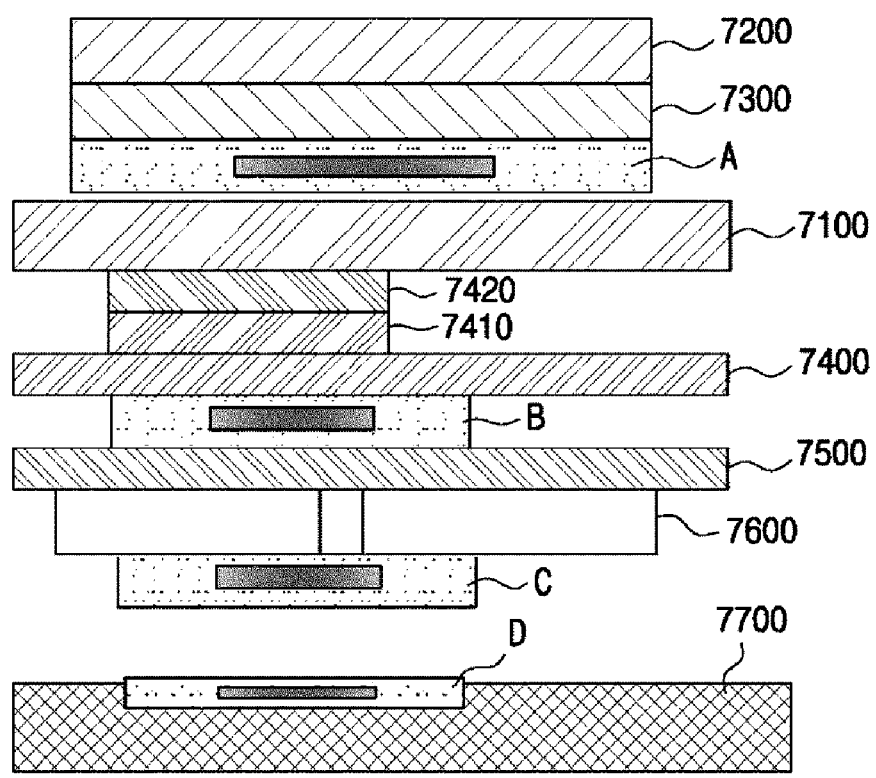
FIG. 28 is a conceptual diagram illustrating positions in a portable terminal in which a hybrid insulation sheet according to the present invention is mounted.

FIG. 28 is a conceptual diagram illustrating positions in a portable terminal in which a hybrid insulation sheet according to the present invention is mounted.

The insulation sheet according to the present invention described above is mounted in various areas of a portable terminal, to thereby spread heat generated in the heat generating component of the portable terminal and suppress the heat from being delivered to the outside.

Therefore, the insulation sheet according to the present invention is built in the inside of the portable terminal to thus prevent a low-temperature burn due to heat generated in operation of the portable terminal.

That is, as shown in FIG. 28, a portable terminal includes: a bracket 7100 in which various components are mounted for driving the portable terminal; a display panel 7200 mounted on the bracket 7100; a cushion layer 7300 that positioned between the bracket 7100 and the display panel 7200; a flexible printed circuit board (FPCB) 7400 in which an AP (Application Processor) IC and a PM (Power Management) IC 7410 are mounted; a TIM (Thermal Interface Material) paste 7420 that is interposed between the AP IC and PM IC 7410 and the bracket 7100 for heat transfer; a removable back cover 7700; an inner cover 7500 that is positioned between the FPCB 7400 and the back cover 7700 and covers the bracket 7100 and the FPCB 7400; and a case 7600 containing a USIM (universal subscriber identity module card) chip and a micro memory that are mounted in the inner cover 7500.

The display panel 7200 is a panel such as an OLED panel and a LCD panel, capable of displaying a screen, and exposed on the front of the portable terminal. The back cover is mounted on the rear side of the portable terminal.

In the portable terminal configured above, the hybrid insulation sheet is mounted in at least one selected from a region (A) of a cushion layer 7300 facing the bracket 7100, a region (B) between a FPCB 7400 and an inner cover 7500, a region (C) of a case 7600 where a USIM chip and micro memory are mounted, and a region (D) of a back cover 7700, to thus spread and radiate heat generated from heat generating components and suppress the heat from being delivered to the outside of the electronic apparatus and maintain an external temperature of the electronic apparatus to be at a certain temperature or below.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention provides an insulating sheet that spreads heat generated from a heat generating component of an electronic apparatus to prevent deterioration of the heat generating component, and blocks the heat generated from the heat generating component from being delivered to the other components.

What is claimed are:

1. A hybrid insulation sheet comprising:
a radiating layer that spreads and radiates heat generated from a heat generating component of an electronic apparatus; and
an insulating layer that suppresses the heat saturated in the radiating layer from being delivered to the outside of the electronic apparatus,
wherein the radiating layer comprises a first radiating layer having a first conductivity and a second radiating layer having a second conductivity bonded on the first radiating layer; and
wherein the first conductivity is lower than the second conductivity.

2. The hybrid insulation sheet according to claim 1, wherein the radiating layer comprises a plate-like member having a conductivity of at least 200 W/mk.

3. The hybrid insulation sheet according to claim 1, wherein the insulating layer comprises a porous substrate having a large number of fine pores that form air pockets capable of trapping air.

4. The hybrid insulation sheet according to claim 3, wherein the fine pores are less than 5 µm in size.

5. The hybrid insulation sheet according to claim 3, wherein the porous substrate is formed of one selected from a nano-fiber web, a non-woven fabric, and a laminate structure of the nano-fiber web and the non-woven fabric, having a number of pores that are formed by accumulating nano-fibers.

6. The hybrid insulation sheet according to claim 5, wherein the nano-fiber web comprises one selected from the group consisting of oligomer polyurethane, polymer polyurethane, PS (polystyrene), PVA (polyvinylalchol), PMMA (polymethyl methacrylate), PLA (polylacticacid), PEO (polyethyleneoxide), PVAc (polyvinylacetate), PAA (polyacrylic acid), PCL (polycaprolactone), PAN (polyacrylonitrile), PMMA (polymethyl methacrylate), PVP (polyvinylpyrrolidone), PVC (polyvinylchloride), nylon, PC (polycarbonate), PEI (polyetherimide), PVdF (polyvinylidene fluoride), PEI (polyetherimide), PES (polyethersulphone), and a mixture thereof.

7. The hybrid insulation sheet according to claim 1, wherein the radiating layer comprises a thin film member formed of one selected from Cu, Al, Ni, Ag, and graphite.

8. The hybrid insulation sheet according to claim 1, further comprising an adhesive layer that bonds the radiating layer and the insulating layer to each other.

9. The hybrid insulation sheet according to claim 8, wherein the adhesive layer comprises one of acrylic, epoxy, aramid-based, urethane-based, polyamide-based, polyethylen-based, EVA-based, polyester-based, and PVC-based adhesives.

10. The hybrid insulation sheet according to claim 8, wherein the adhesive layer comprises a hot melt web or a hot melt powder having a large number of pores formed by accumulating fibers capable of being thermally bonded.

11. The hybrid insulation sheet according to claim 9, wherein the adhesive layer comprises a conductive filler for thermal spreading of an aspect ratio of 1:100, and a spherical conductive filler for thermal transfer.

12. The hybrid insulation sheet according to claim 1, wherein the first radiating layer is attached to, contacts or approaches the heat generating component.

13. The hybrid insulation sheet according to claim 1, wherein the first radiating layer and the second radiating layer are diffusedly bonded or adhesively bonded.

14. The hybrid insulation sheet according to claim 1, further comprising a thermal radiation thin film formed on the radiating layer.

15. The hybrid insulation sheet according to claim 14, wherein the thermal radiation thin film is one of a coating film containing a graphene powder, a graphene thin film, and a film that is obtained by being coated with a nano-sol form which heat radiation particles are dispersed and being gelated and heat-treated.

16. The hybrid insulation sheet according to claim 1, further comprising an oxidation preventing film on the surface of the radiating layer.

17. The hybrid insulation sheet according to claim 16, wherein the oxidation preventing film comprises a Ni coated film.

18. An electronic apparatus comprising: a bracket; a display panel mounted on the bracket; a cushion layer that positioned between the bracket and the display panel; a flexible printed circuit board (FPCB) in which an AP (Application Processor) IC and a PM (Power Management) IC are mounted; a removable back cover; an inner cover that is positioned between the FPCB and the back cover and covers the bracket and the FPCB; and a case containing a USIM (universal subscriber identity module card) chip and a micro memory that are mounted in the inner cover, wherein the electronic apparatus further comprises a hybrid insulation sheet claimed in claim 1, wherein the hybrid insulation sheet is mounted in at least one selected from a region of the cushion layer facing the bracket, a region between the FPCB and the inner cover, a region of the case where a USIM chip and micro memory are mounted, and a region of the back cover, to thus spread and radiate heat generated from heat generating components and suppress the heat from being delivered to the outside of the electronic apparatus and maintain an external temperature of the electronic apparatus to be at a certain temperature or below.

19. An electronic apparatus comprising:
a bracket;
a display panel mounted on the bracket;
a cushion layer that positioned between the bracket and the display panel;
a flexible printed circuit board (FPCB) in which an AP (Application Processor) IC and a PM (Power Management) IC are mounted;
a removable back cover;
an inner cover that is positioned between the FPCB and the back cover and covers the bracket and the FPCB; and
a case containing a USIM (universal subscriber identity module card) chip and a micro memory that are mounted in the inner cover,
wherein the electronic apparatus further comprises a hybrid insulation sheet comprising a radiating layer that spreads and radiates heat generated from a heat generating component of an electronic apparatus; and an insulating layer that suppresses the heat saturated in the radiating layer from being delivered to the outside of the electronic apparatus; and
wherein the hybrid insulation sheet is mounted in at least one selected from a region of the cushion layer facing the bracket, a region between the FPCB and the inner cover, a region of the case where a USIM chip and micro memory are mounted, and a region of the back cover, to thus spread and radiate heat generated from heat generating components and suppress the heat from being delivered to the outside of the electronic apparatus and maintain an external temperature of the electronic apparatus to be at a certain temperature or below.

* * * * *